(12) United States Patent
Rutten et al.

(10) Patent No.: US 10,541,699 B1
(45) Date of Patent: Jan. 21, 2020

(54) SIGNAL PROCESSING AND CONVERSION

(71) Applicant: NXP B.V., Eindhoven (NL)

(72) Inventors: Robert Rutten, Nistelrode (NL);
Massimo Ciacci, Den Bosch (NL);
Manfred Zupke, Hamburg (DE);
Lucien Johannes Breems, Waalre (NL); Johannes Hubertus Antonius Brekelmans, Nederweert (NL);
Muhammed Bolatkale, Rijswijk (NL);
Shagun Bajoria, Eindhoven (NL);
Soheil Bahrami, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/157,355

(22) Filed: Oct. 11, 2018

(51) Int. Cl.
*H03M 1/06* (2006.01)
*H03M 3/00* (2006.01)
*H03M 1/00* (2006.01)

(52) U.S. Cl.
CPC ............. *H03M 1/06* (2013.01); *H03M 1/002* (2013.01); *H03M 3/322* (2013.01); *H03M 3/424* (2013.01); *H03M 3/50* (2013.01)

(58) Field of Classification Search
CPC ........ H03M 3/50; H03M 3/424; H03M 3/322; H03M 1/002; H03M 1/06; H03M 3/458; H03M 1/08; H03M 1/12; H03M 1/66; H03M 3/414; H03M 3/464; H03M 1/1071; H03M 1/124; H03M 3/30; H03M 3/358; H03M 3/422; H03M 1/00; H03M 1/001; H03M 1/1023
USPC .................................................. 341/118–121
See application file for complete search history.

(56) References Cited

U.S. PATENT DOCUMENTS

| 6,313,775 B1* | 11/2001 | Lindfors | H03M 3/424 341/118 |
| 2003/0085825 A1* | 5/2003 | Jensen | H03M 1/0673 341/143 |
| 2012/0075132 A1* | 3/2012 | Lai | H03M 3/38 341/143 |
| 2013/0064271 A1* | 3/2013 | van de Beek | H04L 25/0266 375/219 |

(Continued)

OTHER PUBLICATIONS

Witte et al., "Background DAC Error Estimation Using a Pseudo Random Noise Based Correlation Technique for Sigma-Delta Analog-to-Digital Converters," IEEE Transactions on Circuit and Systems-I: Regular Papers, vol. 57, No. 7 (Jul. 2010).

(Continued)

*Primary Examiner* — Linh V Nguyen

(57) ABSTRACT

Aspects of the disclosure are directed to compensating for errors in in an analog-to-digital converter circuit (ADC). As may be implemented in accordance with one or more embodiments, an apparatus and/or method involves an ADC that converts an analog signal into a digital signal using an output from a digital-to-analog converter circuit (DAC). A compensation circuit generates a compensation output by, for respective signal portions provided to the DAC, generating a feedback signal based on an incompatibility between the conversion of the signal portions into an analog signal and the value of the signal portions provided to the DAC. A compensation output is generated based on the signal input to the DAC with a gain applied thereto, based on the feedback signal.

18 Claims, 9 Drawing Sheets

(56) References Cited

U.S. PATENT DOCUMENTS

| | | | |
|---|---|---|---|
| 2013/0234773 A1* | 9/2013 | Mueller | H03M 1/1033 |
| | | | 327/307 |
| 2017/0077937 A1* | 3/2017 | Shu | H03M 1/001 |
| 2017/0222657 A1* | 8/2017 | Ullmann | H03M 3/414 |
| 2018/0013439 A1* | 1/2018 | Pilly | H03L 7/00 |

OTHER PUBLICATIONS

De Bock et al., "Improved offline calibration for DAC mismatch in low OSR Sigma Delta ADCs with distributed feedback," IEEE Int. Symp. Circuits and Syst. (ISCAS 2014).

\* cited by examiner

SIGNAL PROCESSING AND CONVERSION

OVERVIEW

Aspects of various embodiments are directed to processing signals involving the conversion of analogue signals to digital signals in an analogue-to-digital converter (ADC), such as where a digital to analog converter (DAC) output signal is combined with an analog ADC input signal.

A multitude of signal processing applications involve the conversion of received analog signals into digital values for processing. Such approaches have been widely implemented for successfully processing signals in many different applications. For such applications, converting and otherwise processing the signals accurately can be challenging, in view of which much effort may be put forth in ensuring that the resulting signals are accurate.

One type of ADC involves sigma-delta conversion, in which an analog input signal is sampled and quantized into a digital signal. The digital signal may be processed through unary DACs, with the resulting analog signal added to the input signal to reduce errors in the quantization. However, while this approach has been useful, errors in the DACs and/or otherwise present challenges to providing an accurate analog feedback signal.

These and other matters have presented challenges to efficiencies and accuracy of various signal processing and conversion implementations, for a variety of applications.

SUMMARY

Various example embodiments are directed to issues such as those addressed above and/or others which may become apparent from the following disclosure concerning the processing of signals, and particularly the conversion of analog signals to digital signals.

In certain example embodiments, aspects of the present disclosure involve ascertaining mismatches between respective digital-to-analogue convertor (DAC) circuits, and compensating for the mismatches. Such an approach may, for example, involve determining mismatch values for respective DACs by correlating usage of individual DAC components with a (compensated) output signal of the ADC (e.g., a multi-bit sigma-delta ADC). In this context, each DAC circuit may be part of an overall DAC, with each DAC circuit converting a LSB unit or other portion of a digital signal converted by the overall DAC.

In accordance with one or more aspects of the disclosure, an apparatus for error compensation includes an analog-to-digital converter (ADC) circuit configured and arranged to convert an analog signal into a digital signal, a plurality of digital-to-analog converter (DAC) circuits respectively configured and arranged to convert a portion of the digital signal into an analog signal, and a compensation circuit configured and arranged to correct an output of the ADC circuit. Specifically, the compensation circuit corrects the output by generating, for each DAC circuit, a feedback signal indicative of an incompatibility between an analog output of the DAC circuit, as converted to a digital signal by the ADC circuit, and digital inputs provided to the DAC circuits. Respective gains are applied to the digital inputs from each DAC circuit based on the feedback signal for the corresponding DAC circuit, therein providing modified digital inputs. The corrected output is then generated based on a combination of the digital signal output from the ADC and the modified digital inputs to the respective DAC circuits.

Another aspect of the disclosure is directed to a method for error compensation in an analog-to-digital converter (ADC) circuit having a digital-to-analog converter (DAC) circuit that generates an analog signal used in converting an analog input signal to a digital signal. For each respective LSB unit of a digital signal converted by the DAC circuit, a feedback signal is generated and that is indicative of a mismatch between an analog output of the DAC circuit, as converted to a digital signal by the ADC circuit, and a digital signal input to the DAC circuits. A gain is applied to the unit of the digital signal converted by the DAC circuit based on the feedback signal. Errors in the DAC circuit are compensated using the respective bits of the digital signal with the gain applied thereto.

Another aspect of the disclosure is directed to an apparatus for estimating and correcting errors in an analog-to-digital converter (ADC) circuit. The apparatus includes a plurality of variable gain circuits respectively configured and arranged to apply a gain to a portion of a signal provided to a digital-to-analog converter (DAC) circuit based on feedback signals for the respective portions of the signal. A feedback circuit is configured and arranged to generate the respective feedback signals for each DAC circuit, each feedback signal being based on an output of the DAC circuit for which it is provided and an input signal provided to the DAC circuit. An output circuit is configured and arranged to correct the output of the ADC circuit using the respective outputs of the variable gain circuits.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
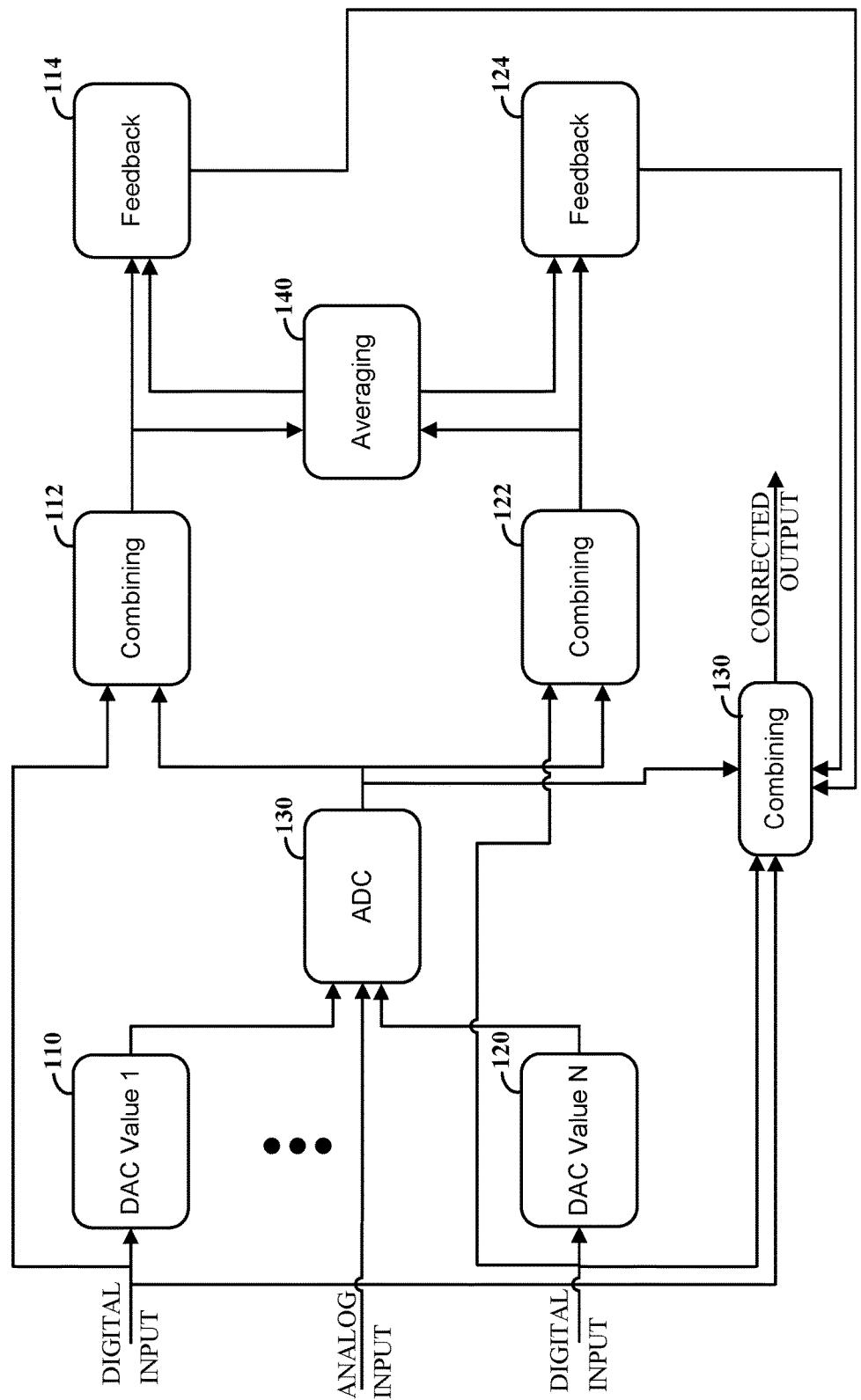
FIG. 1 shows an ADC apparatus with feedback, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving signal processing, as may be applicable to a multitude of disparate types of communications. In certain implementations, aspects of the present disclosure have been shown to be beneficial when used in the context of radio communications, such as those utilized in automobiles and other vehicles, and in these and other applications that may employ sigma-delta ADCs. In some embodiments, signals converted from analog to digital form are processed to provide feedback and related correction to facilitate characterization and correction of mismatch, error or other processing aspects. While not necessarily so limited, various aspects may be appreciated through the following discussion of non-limiting examples which use exemplary contexts.

Various embodiments are directed to improving signal processing in an ADC such as a delta-sigma ADC. An analog signal is sampled and quantized into a digital signal and delta modulated (encoding the voltage or current of the input signal). A corresponding signal (e.g., the digital signal or a corresponding thermometer code used in generating the digital signal) is passed through one or more 1-bit DACs. The resulting analog feedback signal from the DACs is subtracted (delta) to the input analog signal at it is being processed (a sigma operation can be carried out in a loopfilter, which may include integrators (sigma)). As part of this process, feedback is generated and provided to the signal corresponding to respective outputs of the DACs, which accounts for mismatch across the respective DACs and improves the resulting signal that is subtracted from the input analog signal.

As used herein, a DAC may involve respective units (e.g., circuits) therein, with mismatch between the units being estimated and compensated for. For example, a 2-bit quantizer can be used, with the 2-bit value being encoded into a 3-bit code that provides an indication of how the DAC-units are configured.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed toward circuitry and related methods involving the conversion of analog signals to digital signals. Such embodiments may, for example, involve a sigma-delta (SD) analog to digital converter (ADC). An analog loopfilter with transfer "H" may be fed with a signal obtained by subtracting the main analog input signal and a feedback signal generated by a digital to analog converter (DAC). The output of the loopfilter may be sampled and quantized at a high sampling rate. The quantizer resolution may be generally low, such as 2 binary bits, and the quantizer may produce a multi-bit (e.g., 3-bit) thermometer coded output. The thermometer code is shuffled by a random control signal (e.g., pseudo-random signal), resulting in a scrambled thermometer code "$D_{[2:0]}$." In a more particular embodiment, the value of the summed thermometer coded bits is equal to the sum of elements at the output of the quantizer. The digital representation for Dx is 0's and 1's, in which a binary 0 is represented by −1, while a binary 1 is represented by +1. The combined output Y can be computed by:

$$Y = D_0 + D_1 + D_2, \quad \text{Equation 1}$$

where $D_0$, $D_1$ and $D_2$ are respective bit outputs of the DAC. The shuffled data is converted to the analog domain by the DAC, which may include three unit elements (circuits) each having unit element value "u." Such unit elements may, for example, be implemented as a respective DAC circuit that, together, form the bit outputs of the DAC. Each unit can be activated as +u or −u, depending on $D_{[2:0]}$. The outputs of the three unit elements are combined before they are subtracted from the input signal.

Each DAC element may have a certain mismatch compared to their desired value u. The mismatches are represented by $\varepsilon_{[2:0]}$. The output frequency domain representation for Y of this sigma date loop equals:

$$Y = X \cdot H - (D_0 + D_1 + D_2) \cdot u \cdot H + \quad \text{Equation 2}$$
$$Q_e - (D_0 \cdot \varepsilon_0 + D_1 \cdot \varepsilon_1 + D_2 \cdot \varepsilon_2) \cdot H,$$

$$Y = \frac{X \cdot H}{1 + u \cdot H} + \frac{Q_e}{1 + u \cdot H} - \frac{(D_0 \cdot \varepsilon_0 + D_1 \cdot \varepsilon_1 + D_2 \cdot \varepsilon_2) \cdot H}{1 + u \cdot H}. \quad \text{Equation 3}$$

The last term is the error caused by static DAC mismatch, which can be corrected for by adding a term with the opposite value. The transfer function, $$STF = \frac{H}{1 + u \cdot H}, \quad \text{Equation 4}$$

may be constant for frequencies which are the band of interest. In that case, the error term can be compensated for when there is a way to extract the errors $\varepsilon_{[2:0]}$, knowing $D_{[2:0]}$. Multiplying the combined output signal Y with the individual $D_{[2:0]}$ produces:

$$Y \cdot D_0 = \frac{X \cdot H \cdot D_0}{1 + u \cdot H} + \frac{Q_e \cdot D_0}{1 + u \cdot H} - \quad \text{Equation 5}$$
$$\frac{(D_0^2 \cdot \varepsilon_0 + D_0 \cdot D_1 \cdot \varepsilon_1 + D_0 \cdot D_2 \cdot \varepsilon_2) \cdot H}{1 + u \cdot H}$$

$$Y \cdot D_1 = \frac{X \cdot H \cdot D_1}{1 + u \cdot H} + \frac{Q_e \cdot D_1}{1 + u \cdot H} - \quad \text{Equation 6}$$
$$\frac{(D_1^2 \cdot \varepsilon_1 + D_1 \cdot D_0 \cdot \varepsilon_0 + D_1 \cdot D_2 \cdot \varepsilon_2) \cdot H}{1 + u \cdot H}$$

$$Y \cdot D_2 = \frac{X \cdot H \cdot D_2}{1 + u \cdot H} + \frac{Q_e \cdot D_2}{1 + u \cdot H} - \quad \text{Equation 7}$$
$$\frac{(D_2^2 \cdot \varepsilon_2 + D_2 \cdot D_0 \cdot \varepsilon_0 + D_2 \cdot D_1 \cdot \varepsilon_1) \cdot H}{1 + u \cdot H}$$

Since $D_x$ is either +1 or −1, $D_x^2 = 1$. Assuming that probabilities P(D0,=1), P(D1=1) and P(D2=1) are equal (e.g., guaranteed by the shuffle control signal):

$$AVG(D_0) = AVG(D_1) = AVG(D_2) \quad \text{Equation 8}$$

Then, the following holds for the first term in the $Y \cdot D_x$ equations:

$$AVG\left(\frac{X \cdot H \cdot D_0}{1+u \cdot H}\right) = $$
$$AVG\left(\frac{X \cdot H \cdot D_1}{1+u \cdot H}\right) = AVG\left(\frac{X \cdot H \cdot D_2}{1+u \cdot H}\right) = AVG\left(\frac{X \cdot H \cdot (D_x)}{1+u \cdot H}\right) \quad \text{Equation 9}$$

This means the same average value can be subtracted from each error signal

For the $$\frac{Q_e \cdot D_x}{1+u \cdot H},$$

the average values may not be same, since $Q_e$ may depend on the DAC-element that was chosen.

$$\frac{Q_e}{1+u \cdot H}$$

contains mainly high-frequency content, since it is filtered by the NTF of the modulator. By low-pass-filtering Y such that the high frequency noise is suppressed, $$\frac{Q_e}{1+u \cdot H} \approx 0,$$

which limits the contribution of $$\frac{Q_e \cdot D_x}{1+u \cdot H}$$

to the error signal. The last term in the error signal contains DAC element error information, modulated by the data signals $D_{[2:0]}$ and filtered by the STF. There are three errors ($\varepsilon_{[2:0]}$) that are estimated to correct the DAC mismatches. It is possible to linearize the 3-element DAC with two variables. This simplifies the problem; one variable is eliminated by enforcing the following restriction:

$$\varepsilon_0+\varepsilon_1+\varepsilon_2=0 \quad \text{Equation 10}$$

This may result in a DAC gain error which may be corrected. From Equation 8, the following can be derived:

$$AVG(D_0 \cdot D_1)=AVG(D_2 \cdot D_3)=AVG(D_0 \cdot D_3)=AVG (D_x \cdot D_y)\{x \neq y\} \quad \text{Equation 11}$$

With this simplification, the last term of Equation 5, it can be simplified to $$AVG\left(\frac{(D_2^2 \cdot \varepsilon_2 + D_2 \cdot D_0 \cdot \varepsilon_0 + D_2 \cdot D_1 \cdot \varepsilon_1) \cdot H}{1+u \cdot H}\right) = $$
$$AVG\left(\frac{(D_2^2 \cdot \varepsilon_2 + D_x \cdot D_y \cdot (\varepsilon_0 + \varepsilon_1)) \cdot H}{1+u \cdot H}\right) = $$
$$AVG\left(\frac{(D_2^2 \cdot \varepsilon_2 - D_x \cdot D_y \cdot \varepsilon_2) \cdot H}{1+u \cdot H}\right) \quad \text{Equation 12}$$

When Y is low-pass filtered, such that term $(Q_e \cdot D_x)/(1+u \cdot H)$ can be neglected, together with Equation 10 and Equation 11, Equation 5, Equation 6 and Equation 7 can be approximated for low frequencies as ($D_x \cdot D_y$ parts are averaged values):

$$Y \cdot D_0 \approx \left(\frac{X \cdot H \cdot D_0}{1+u \cdot H}\right) - \frac{(D_0^2 \cdot \varepsilon_0 - D_x \cdot D_y \cdot \varepsilon_0) \cdot H}{1+u \cdot H} \quad \text{Equation 13}$$

$$Y \cdot D_1 \approx \left(\frac{X \cdot H \cdot D_1}{1+u \cdot H}\right) - \frac{(D_1^2 \cdot \varepsilon_1 - D_x \cdot D_y \cdot \varepsilon_1) \cdot H}{1+u \cdot H} \quad \text{Equation 14}$$

$$Y \cdot D_2 \approx \left(\frac{X \cdot H \cdot D_2}{1+u \cdot H}\right) - \frac{(D_2^2 \cdot \varepsilon_2 - D_x \cdot D_y \cdot \varepsilon_2) \cdot H}{1+u \cdot H} \quad \text{Equation 15}$$

The second term in Equation 13 is a measure for DAC-element error $\varepsilon_0$, since $D_x^2=1$, and the average of $D_x \cdot D_y$ is typically smaller than 1. Same holds for the other equations for $\varepsilon_1$ and $\varepsilon_2$. The remaining first term is identical for all three equations, so if we subtract the average of the three error signals, this term is eliminated.

As may be implemented in accordance with one of the above example embodiments and/or on or more other example embodiments, an apparatus and or method involves an analog-to-digital converter (ADC) circuit configured and arranged to convert an analog signal into a digital signal, and a plurality of digital-to-analog converter (DAC) circuits, each DAC circuit being configured and arranged to convert a portion of a digital signal into an analog signal. A compensation circuit is configured and arranged to generate a compensation output by, for the output of each DAC circuit, generating a feedback signal based on an indication of an incompatibility between the analog conversion of the digital signal and a signal corresponding to a combined output of an analog conversion by all of the DAC circuits. A gain is applied to a digital signal corresponding to an input to each DAC circuit, based on the feedback signal, and the compensation output is generated based on a digital signal output by the ADC circuit and the modified digital signal (with the gain applied thereto). In some embodiments, different gains are applied to different ones of the inputs to the DAC circuits, each gain being tailored to the mismatch of the output of the DAC circuit relative to the output of the other DAC circuits. In certain implementations, the ADC circuit generates quantized bits, which are also used in providing the corrected output.

The compensation circuit may be implemented in a variety of manners, using a variety of components. In some implementations, the DAC input signal is generated by combining the digital inputs to the DACs with the digital output of the ADC to produce the corrected output. For each respective component of the corrected output that correspond to a particular unit of the DACs, the respective component is multiplied with the modified digital input for the particular one of the DACs. An averaged product of the DACs is generated by combining the product of the multiplying with the product of the multiplying of the other components of the corrected outputs that correspond to other ones of the DACs to provide a combined product, and dividing the combined product by a total number of the DACs. The averaged product is then subtracted from the product of the multiplying and the feedback signal for the particular one of the DACs is generated based upon the difference. In certain implementations, the average value is subtracted from the feedback signal after integration. Further, the compensation circuit may, for example, include a variable gain amplifier and feedback circuit configured to apply a variable gain to the digital input used for generating the feedback signal for each respective digital input.

In certain embodiments, the feedback signal is generated by combining the digital inputs to the DACs with the digital output of the ADC to produce the corrected output. For each respective component of the corrected output that corresponds to a particular one of the DACs, the respective component is multiplied with the modified digital input for the particular one of the DACs. The feedback signal may also be generated by subtracting an averaged value corresponding to the digital inputs provided to all of the DACs. The result of the subtracting may further be combined with the feedback signal. The feedback signal may also be generated by setting a variable gain for the DAC circuit to compensate for analog conversion of the portion of the digital signal to which the variable gain is being applied.

In some embodiments, the ADC circuit converts the analog signal into the digital 01 signal with quantized bits. The DAC circuits convert, for each quantized bit, a corresponding quantized bit into an analog value. The compensation circuit generates the feedback signal based on an indication of an incompatibility between the analog conversion of the quantized bit and a combination of quantized bits provided as inputs to the DAC circuits, and applies the gain to each quantized bit provided as inputs to the DAC circuits, based on the feedback signal. The corrected output is generated based on the quantized bits that are modified with the respective gains applied thereto. In this context, the feedback signal may be generated by subtracting, for respective values corresponding to each DAC circuit, an averaged value corresponding to the digital outputs of all of the DACs. The feedback signal may also be generated by combining the result of the subtracting with the feedback signal. Further, different gain values may be applied to different ones of the quantized bits provided to the respective DAC circuits, each gain value being tailored to the mismatch of an output of the ADC circuit relative to a corresponding input to the DAC circuits.

In connection with one or more embodiments, the input signal to the DACs as characterized herein may be generated using a variety of approaches. In some instances, quantized bits provided are generated and randomized as inputs to the plurality of DAC circuits. In other embodiments, the input signal is generated from and/or based on the output of the ADC.

Various methods may be implemented in accordance with the apparatuses characterized herein above. Further, such methods may be implemented with the apparatuses shown in the figures and characterized below.

Turning now to the figures, FIG. 1 shows an apparatus 100 as may be implemented in accordance with one or more embodiments. The apparatus 100 includes a plurality of DAC units (1-N), with two DACs 110 and 120 shown for simplicity. Each DAC receives a digital input, as may correspond to an analog signal being processed by an ADC 130. The outputs of the respective DACs are combined at ADC 130 and used with an analog input signal to generate a digital output that is used for feedback. Specifically, the digital input to DAC 110 is combined with the output of the ADC at block 112, the digital input to DAC 120 is combined with the output of the ADC at block 122, and the respective outputs of the combining at blocks 112 and 122 are averaged at block 140 and utilized to generate a feedback signal at each of blocks 114 and 124. The respective feedback signals are provided to a combining circuit 130, which applies a gain to the respective digital inputs and combines the inputs with the gain applied thereto with the output of the ADC to provide a corrected output.

Figure 2:
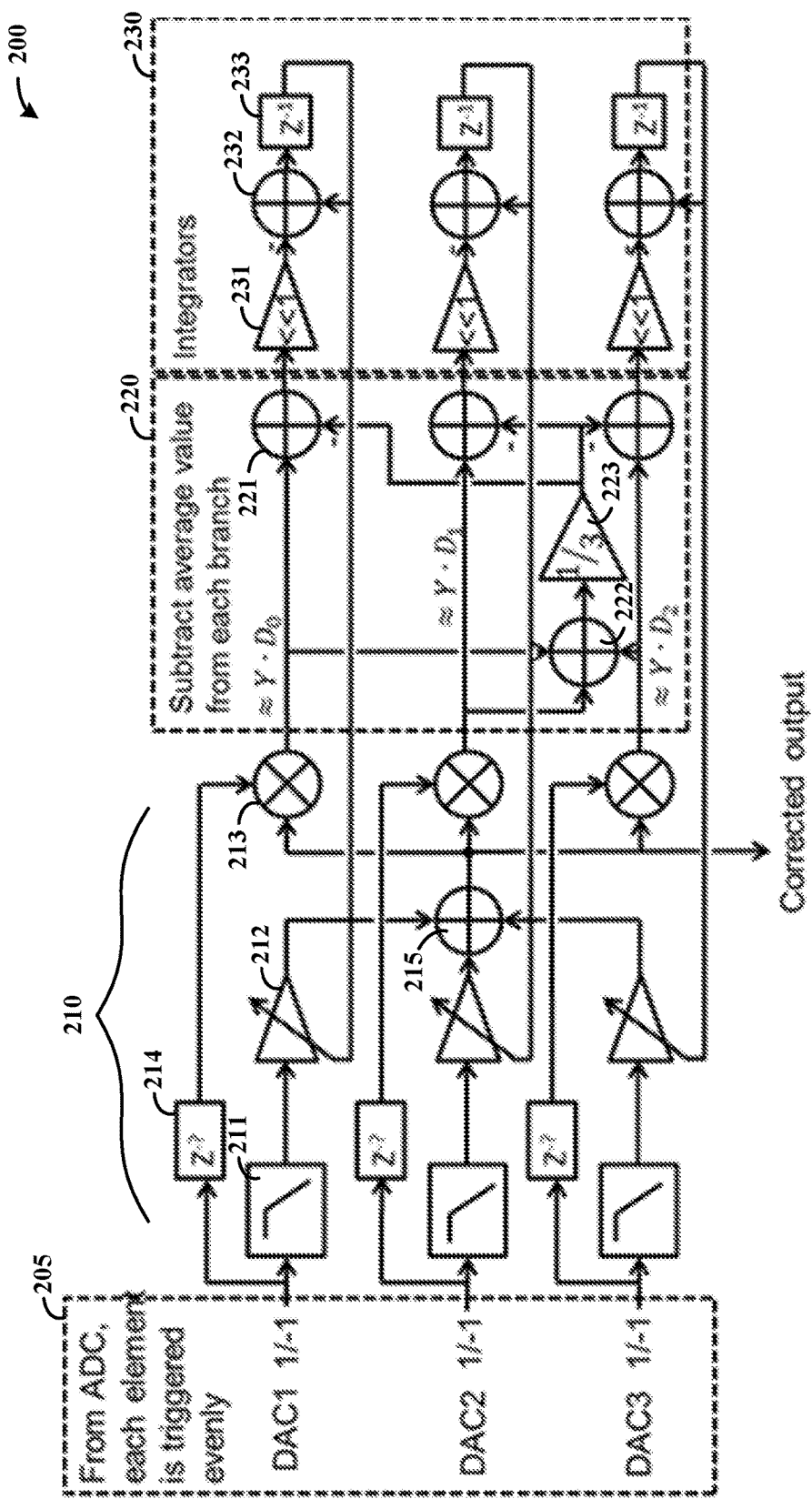
FIG. 2 another ADC apparatus with feedback, in accordance with the present disclosure.

FIG. 2 shows an apparatus 200, which may be utilized for DAC error estimation and compensation, in accordance with one or more embodiments. The apparatus includes a DAC block 205, which generates respective output bits that are processed with an applied feedback gain at 210 to provide a corrected output. Blocks 220 and 230 are utilized to generate the respective feedback gain signals provided for each DAC output. Referring to the upper DAC output for DAC1, the output is passed to filter 211 and low-pass filtered (e.g., to attenuate the $Q_e \cdot D_x/1+u \cdot H$ terms). Each DAC element is filtered individually, so the DAC correction can be done after filtering. A variable gain circuit 212 operates to apply a gain factor to the filtered output, which may correct for DAC errors. The gain values may be 1+estimated DAC errors. The gain-corrected outputs of the DACs are added together at 215 to compose a corrected output signal.

The DAC output signals are delayed "(z-?)" as shown at block 214, to compensate for delay in the low-pass filter. Multipliers (including 213) multiply the compensated output (low-pass filtered, corrected Y) with the individual DAC outputs. This leads to the error indicator values from Equation 13, Equation 14 and Equation 15 ($Y \cdot D_x$) as noted above. These error indicators contain part of the input signal times STF (transfer function), and on average may be the same for all three indicators. The average of the three error signals is generated at 222 and 223 (e.g., added and divided by three), and then subtracted from each error indicator as shown at 221. What is left is (on average) the last term of Equation 13, Equation 14 and Equation 15, which are indicators of the error values. Three individual first order control loops with integrator circuitry (231, 232, 233) minimize these error values by adapting the error correction actuators, and provide an output that is fed back to the variable gain circuits, such as at 212, and used to provide the corrected output from adder 215 (e.g., as an ADC input).

Figure 3:
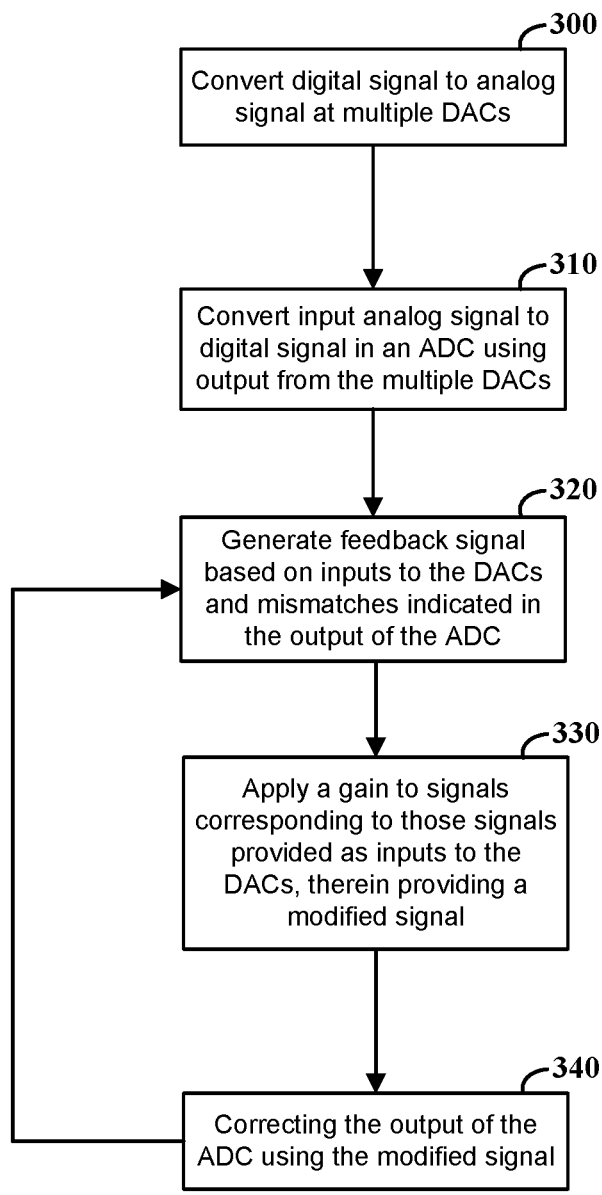
FIG. 3 is a data-flow diagram, in accordance with the present disclosure.

FIG. 3 is a flow diagram for an approach to converting analog signals to digital signals and related error compensation, as may be implemented in accordance with one or more embodiments. At block 300, a digital signal is converted to an analog signal at multiple DACs. An input analog signal is converted signal in an ADC at block 310, using the analog output from the multiple DACs. At block 320, a feedback signal is generated based on input signals provided to the DACs and mismatches indicated in the output of the ADC, which correspond to an analog mismatch in an output of the DACs. A gain is applied to signals corresponding to those provided as inputs to the DACs at block 330. This thus provides a modified signal corresponding to the actual input to the DACs as modified to account for errors in the operation of the DACs to convert the actual input into an analog signal. At block 340, the output of the ADC is corrected using the modified signal. This output may, for example, be provided for use at block 320, as shown via the arrow in the figure.

Figure 4:
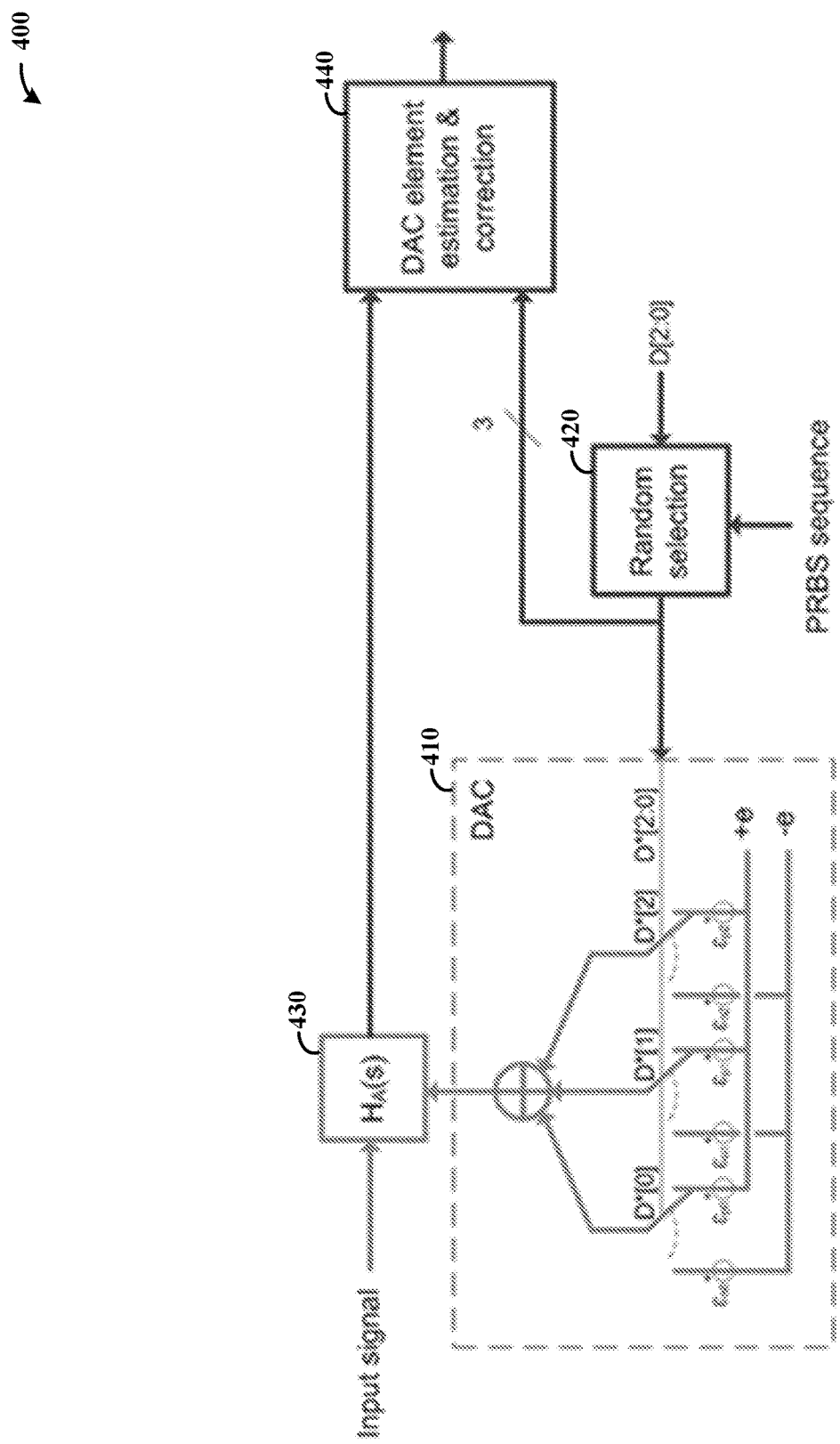
FIG. 4 shows another apparatus for compensating for errors in an ADC, in accordance with the present disclosure.

FIG. 4 shows another apparatus 400, for compensating for errors in an ADC. The apparatus 400 includes a 2-bit (4-level) DAC 410 that is steered with a 3-bits thermometer code D[2:0] provided to a random selector circuit 420, such as by using a pseudorandom binary sequence (PRBS). Static DAC element errors are indicated by $\varepsilon_{p/n0}[2:0]$. The D[2:0] thermometer code may be generated internally or provided as an input from an external source. The following 3-bits codes in Table 1 can be generated with the associated DAC output levels:

TABLE 1

| D * [2] | D * [1] | D * [0] | Intended DAC level | DAC level + error |
|---|---|---|---|---|
| 0 | 0 | 0 | −3*e | −3*e + $\varepsilon_{n0}$ + $\varepsilon_{n1}$ + $\varepsilon_{n2}$ |
| 0 | 0 | 1 | −1*e | −1*e + $\varepsilon_{p0}$ + $\varepsilon_{n1}$ + $\varepsilon_{n2}$ |
| 0 | 1 | 0 | −1*e | −1*e + $\varepsilon_{n0}$ + $\varepsilon_{p1}$ + $\varepsilon_{n2}$ |
| 1 | 0 | 0 | −1*e | −1*e + $\varepsilon_{n0}$ + $\varepsilon_{n1}$ + $\varepsilon_{p2}$ |
| 0 | 1 | 1 | 1*e | 1*e + $\varepsilon_{n0}$ + $\varepsilon_{p1}$ + $\varepsilon_{p2}$ |
| 1 | 1 | 0 | 1*e | 1*e + $\varepsilon_{p0}$ + $\varepsilon_{p1}$ + $\varepsilon_{n2}$ |
| 1 | 0 | 1 | 1*e | 1*e + $\varepsilon_{p0}$ + $\varepsilon_{n1}$ + $\varepsilon_{p2}$ |
| 1 | 1 | 1 | 3*e | 3*e + $\varepsilon_{p0}$ + $\varepsilon_{p1}$ + $\varepsilon_{p2}$ |

The levels −1*e and +1*e can be made in three ways, based on random selection, resulting in D*[2:0]. The output of the DAC is combined with an analog input signal and provided to an analog transfer function circuit 430, which may be partly linear or non-linear, and includes an ADC circuit. The digital output of the analog transfer function circuit is provided along with the D*[2:0] output of the random selector circuit 420 as inputs for a DAC element estimation and correction circuit 440, which may operate as noted above to provide correction relative to respective values generated in the DAC 410.

Figure 5:
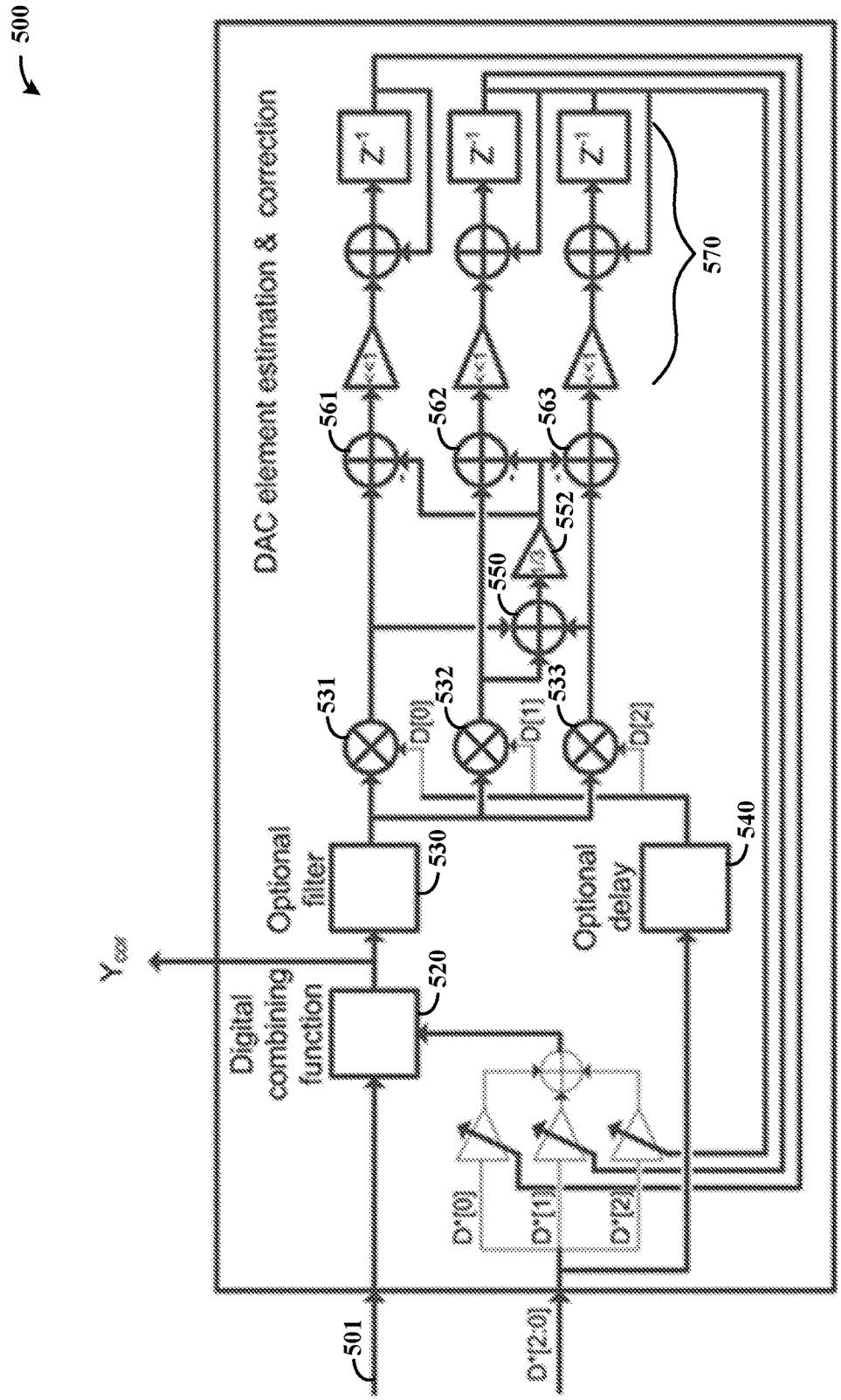
FIG. 5 shows a DAC element estimation and correction circuit, in accordance with the present disclosure.

FIG. 5 shows a DAC element estimation and correction circuit 500, in accordance with another example embodiment. Individual bits D*[2:0] are multiplied with 1+/−a correction factor, where the correction factors may compensate for $\varepsilon_{p/n0}$[2:0] errors. The corrected values are combined with an input 501 generated by an analog to digital conversion circuit, using a digital combining function/circuit 520. In this context, the circuit 500 may be implemented for circuit 440 in FIG. 4, with the input D*[2:0] provided by random selection circuit 420 and the input 501 provided by the analog transfer function circuit 430. The output of the combining function $Y_{cor}$ is the corrected output and may be used for further processing.

In some implementations, a filter circuit 530 filters the output $Y_{cor}$ using a pass-band range tuned such that DAC-errors are deteriorating the performance in the pass-band frequency range. The output of this filter is correlated (using multipliers 531, 532 and 533) with the individual D*[2:0] bits (which may be delayed via delay circuit 540 to accommodate for delay in the optional filter and HA(s)). The filter circuit 530 and delay circuit 540 may be swapped.

The outputs of the correlators 531, 532 and 533 provide a measure of how one single DAC element influences a combined output signal. There may be a strong correlation, since the corrected output $Y_{cor}$ is (partly) constructed from D*[2:0]. This correlation may be (on average) common for each correlator output, since the DAC element selection is pseudo random. This common correlation can be removed by subtracting the average output value from each correlator output, with the average output value being generated at 550 and 552 and subtraction respectively carried out for correlations 531, 532 and 533 at 561, 562 and 563. The output of the correlators 531, 532 and 533 (with common correlation subtracted) are fed to integrators with a small integrator gain. The integrator outputs are used to steer the correction factors which multiply with D*[2:0]. When the integrators have settled, the correction values should be such that all correlator outputs are 'balanced' on average, so there is on average no difference between the correlator outputs.

Figure 6:
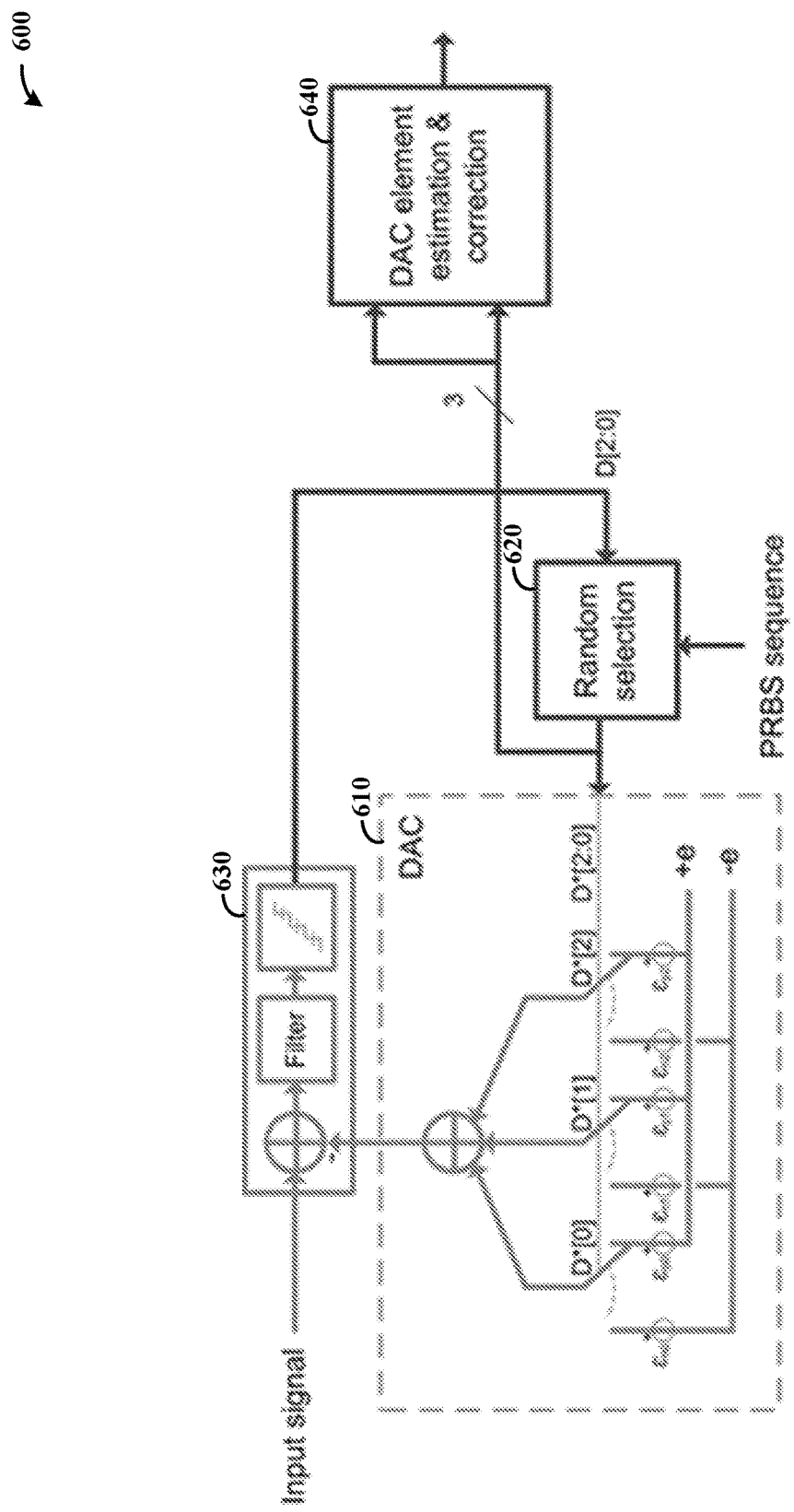
FIG. 6 shows another apparatus for correcting ADC errors, in accordance with the present disclosure.

FIG. 6 shows another apparatus 600 for correcting ADC errors, in accordance with another example embodiment. The apparatus 600 is similar to apparatus 400 of FIG. 4, with a DAC 610, random selector circuit 620, an analog transfer function circuit 630, and a DAC element estimation and correction circuit 640. The analog transfer function circuit 630 includes summations node, where the DAC signal is subtracted from the input signal, followed by an analog loopfilter, the output of which is quantized. Typically, the quantizer has a relatively low resolution. The resolution for a certain frequency band can be increased by an oversampled quantizer clock and a filter transfer of the loopfilter. Any error in the feedback will result in a 1-on-1 error on the digital output. In this sigma-delta case, D*[2:0] can be used as the actual digital output signal (uncompensated).

Figure 7:
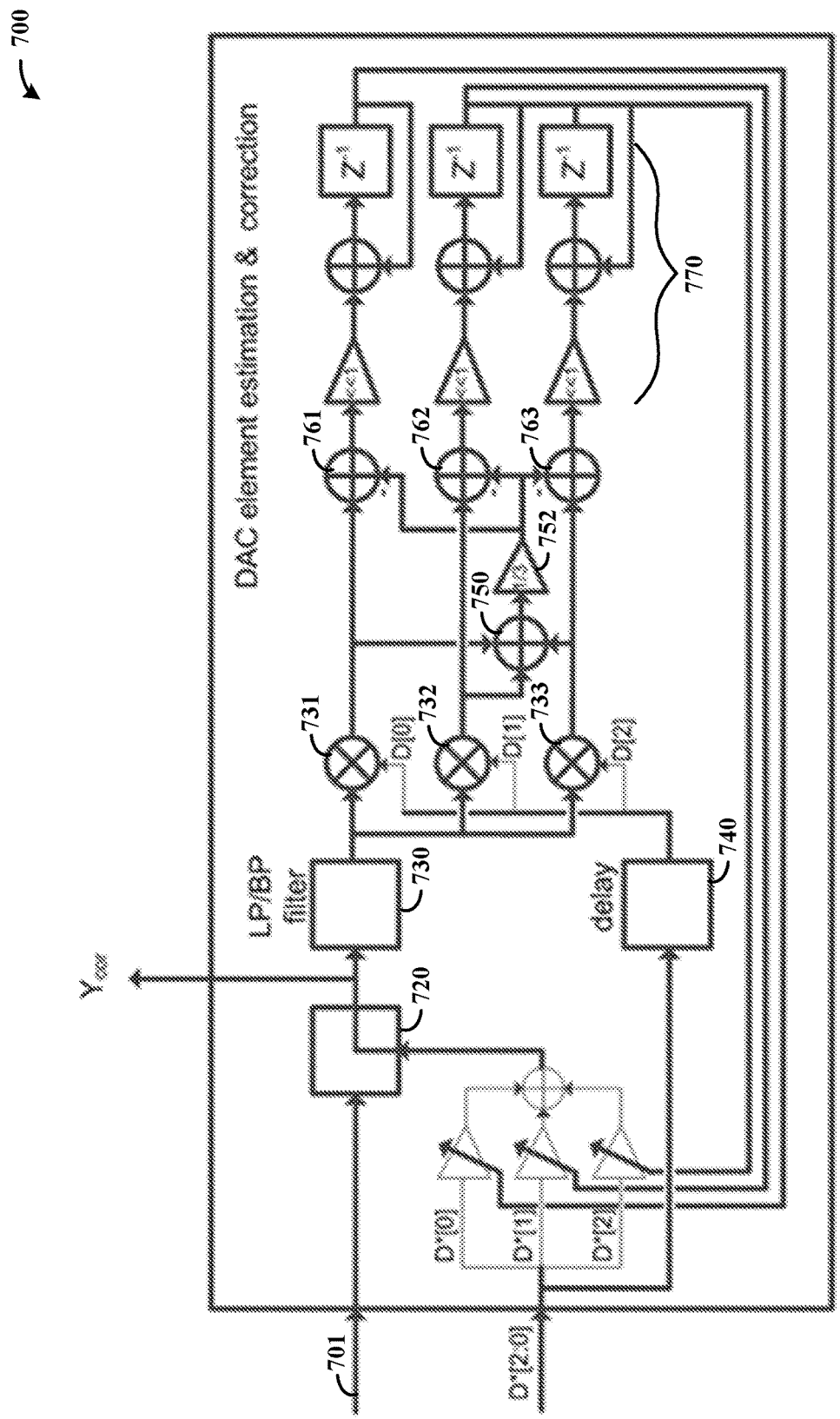
FIG. 7 shows a DAC element estimation and correction circuit, in accordance with the present disclosure.

FIG. 7 shows a DAC element estimation and correction circuit 700, in accordance with another example embodiment. The circuit 700 may, for example, be implemented for a sigma-delta case such as via circuit 640 in FIG. 6, and in a manner similar to that shown and described with FIG. 5 (with similarly numbered componentry). Corrected values are combined with an input 701 generated by an analog to digital conversion circuit, using a digital combining function/circuit 720. The circuit 700 further includes optional filter circuit 730 and delay circuit 740, with the filter circuit filtering the output $Y_{cor}$ which is correlated with the individual D*[2:0] bits using multipliers 731, 732 and 733. The average output value from each correlator output is generated at 750/752 and subtracted respectively from the output of correlators 731, 732 and 733 at 761, 762 and 763, and provided to integrators 770. The integrator outputs are used to steer the correction factors which multiply with D*[2:0].

In some embodiments involving a sigma-delta application, both inputs to the digital combining function/circuit 720 are D*[2:0], utilizing the compensated output and ignoring input 701. The compensated signal is filtered in such an instance, due to quantization noise. The Band-pass or low-pass filter filters the quantization noise out. In certain implementations, strong signals are filtered, mitigating reductions in convergence accuracy of the error estimation system that may occur due to strong signals. This approach may improve estimation accuracy, and with that the convergence speed.

Figure 8:
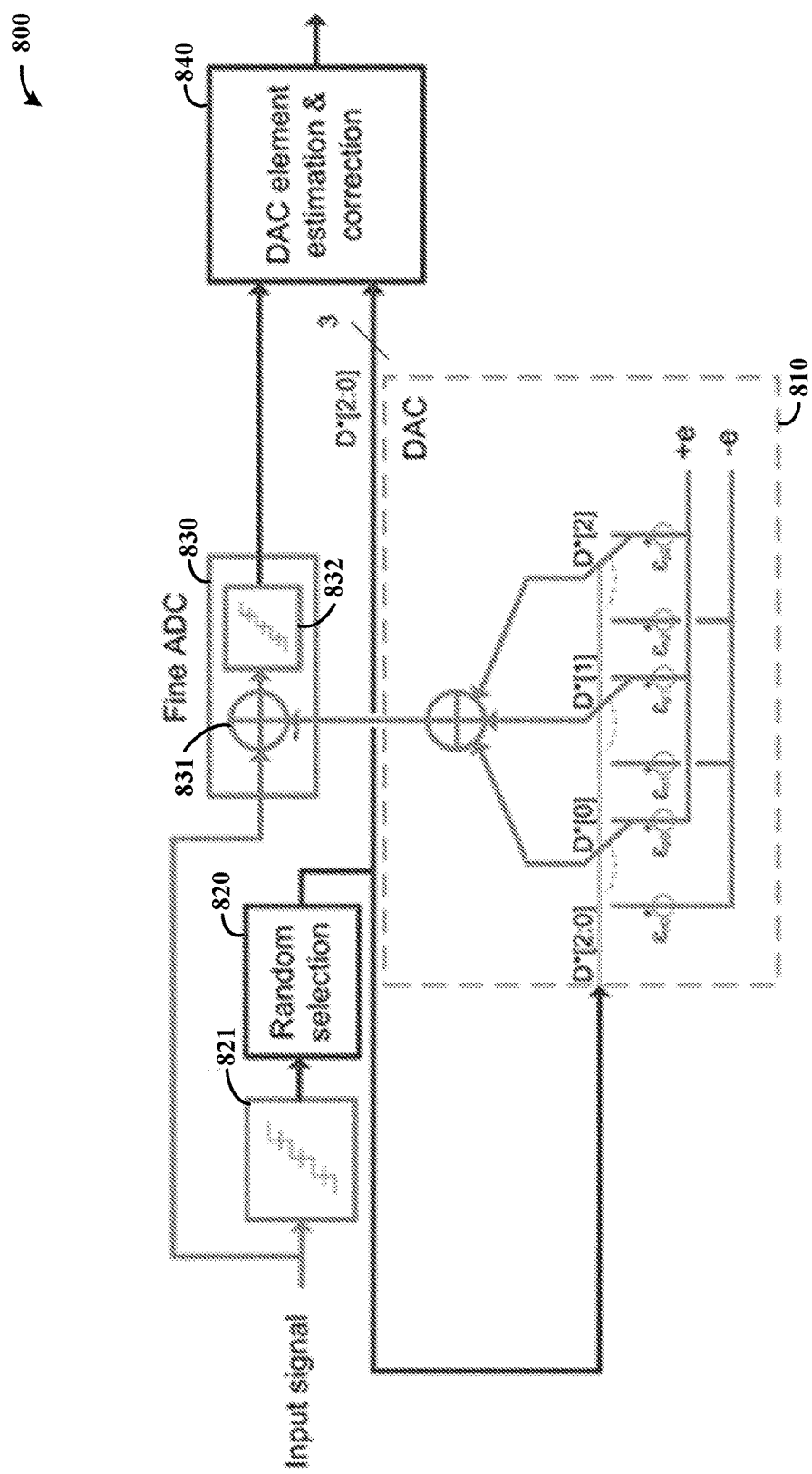
FIG. 8 shows another apparatus for correcting ADC errors, in accordance with the present disclosure.

FIG. 8 shows another apparatus 800 for correcting ADC errors, in accordance with another example embodiment. The apparatus 800 is also similar to apparatus 400 of FIG. 4, with a DAC 810, random selector circuit 820, analog transfer function circuit (with an ADC) 830, and a DAC element estimation and correction circuit 840. An analog input signal is quantized to the digital domain in two steps, first via coarse digitization at block 821 (e.g., into 4 levels), and via fine digitization at analog transfer function circuit 830. A resulting digital code is subtracted from the input signal via DAC 810 and a subtractor 831, and is quantized further with a fine ADC 832. An output code is constructed by adding the coarse ADC code and fine ADC code, within the DAC element estimation and correction circuit 840. In some implementations, the linearity of the fine ADC is relaxed, since the input signal is small (despite being visible in the resulting output code).

Figure 9:
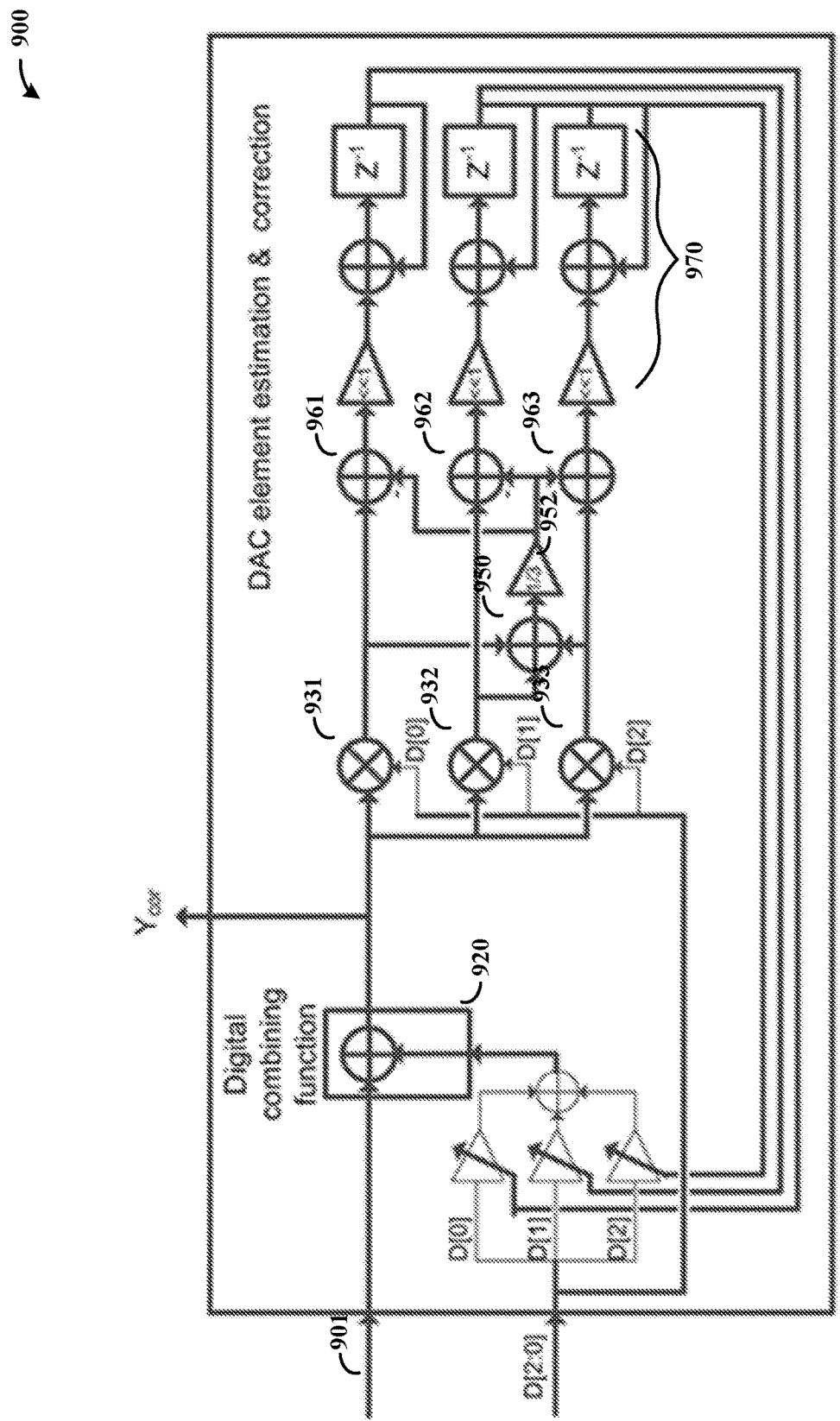
FIG. 9 shows another DAC element estimation and correction circuit, in accordance with the present disclosure.

FIG. 9 shows another DAC element estimation and correction circuit 900, in accordance with another example embodiment. The circuit 900 may, for example, be implemented as circuit 840 in FIG. 8, and in a manner similar to that shown and described with FIG. 5 and with similarly numbered componentry. Digital combining function/circuit 920 combines input 901 with corrected input D[2:0], multipliers 931, 932 and 933 correlate the output $Y_{cor}$ with the inputs. The correlated outputs are averaged via averaging circuitry 950/952, with the average being subtracted from the correlated outputs by subtracting circuitry 961, 962 and 963, the output of which is provided to integrators 970 to provide respective feedback signals for compensating each respective input component as shown. When implemented with FIG. 8, the coarse codes can be calibrated with variable gains before adding the coarse code with the fine code.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, converter, integrator, and/or other circuit-type depictions (e.g., reference numerals 112, 114, 122, 124, 130 and 140 of FIG. 1, depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1-9. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with error estimation herein, such as shown in and described in connection with FIG. 3, is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to combine . . . " is interpreted as "circuit configured to combine . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the methods characterized with FIG. 3 may be implemented with one or both of the apparatuses shown in FIGS. 1 and 2, with FIGS. 4 and 5, with FIGS. 6 and 7, and with FIGS. 8 and 9. As another example, different manners in which to generate feedback may be employed, to suit particular applications and/or utilize available componentry, while achieving the described functional operation. Such modifications do not depart from the true spirit and scope of various aspects of the disclosure, including aspects set forth in the claims.

What is claimed is:

1. An apparatus for error compensation, the apparatus comprising:
    an analog-to-digital converter circuit (ADC) configured and arranged to convert an analog signal into a digital signal;
    a plurality of digital-to-analog converter circuits (DACs), each DAC being configured and arranged to convert a portion of the digital signal into an analog signal; and
    a compensation circuit configured and arranged to correct an output of the ADC by:
        for each DAC, generating a feedback signal indicative of an incompatibility between an analog output of the DAC, as converted to a digital signal by the ADC, and digital inputs provided to the DAC;
        for each DAC, applying respective gains to the digital inputs to the DAC based on the feedback signal for the DAC, therein providing modified digital signals; and
        generating the corrected output based on a combination of a digital signal output from the ADC and the modified digital signals provided by the DACs;
    wherein generating the feedback signal includes subtracting an averaged value corresponding to the digital inputs provided to all of the DACs.

2. The apparatus of claim 1, wherein the compensation circuit is configured and arranged to generate the feedback signal by:
    combining the digital inputs to the DACs with the digital output of the ADC to produce the corrected output; and
    for each respective component of the corrected output that correspond to a particular one of the DACs,
        multiplying the respective component with the modified digital input for the particular one of the DACs,
        generating an averaged product of the DACs by combining the product of the multiplying with the product of the multiplying of the other components of the corrected outputs that correspond to other ones of the DACs to provide a combined product, and dividing the combined product by a total number of the DACs, and
        subtracting the averaged product from the product of the multiplying and generating the feedback signal for the particular one of the DACs based upon the difference.

3. The apparatus of claim 1, wherein the compensation circuit is configured and arranged to generate the feedback signal by:
    combining the digital inputs to the DACs with the digital signal output from the ADC to produce the corrected output,
    for each respective component of the corrected output that corresponds to a particular one of the DACs, multiplying the respective component with the modified digital signal for the particular DAC.

4. The apparatus of claim 1, wherein the compensation circuit includes, for each digital input for each DAC, a variable gain amplifier and feedback circuit configured to apply a variable gain to the digital input used for generating the feedback signal.

5. The apparatus of claim 1, wherein generating the feedback signal includes combining the result of the subtracting with the feedback signal.

6. The apparatus of claim 1, wherein generating the feedback signal includes setting a variable gain for the DAC to compensate for analog conversion of the portion of the digital signal to which the variable gain is being applied.

7. The apparatus of claim 1, wherein applying the respective gains includes, for respective ones of the DACs, applying different gains to different ones of the inputs to the DACs, each gain being tailored to a mismatch of the output of the DAC relative to the output of the other DAC.

8. The apparatus of claim 1, wherein the compensation circuit is configured and arranged to correct the output of the ADC by generating quantized bits representing an analog signal input to the ADC.

9. The apparatus of claim 1, wherein:
the ADC is configured and arranged to convert the analog signal into the digital signal by generating the digital signal with quantized bits;
the DACs are configured and arranged to, for each quantized bit, convert a corresponding quantized bit into an analog value; and
the compensation circuit is configured and arranged to:
generate the feedback signal based on an indication of an incompatibility between the analog conversion of the quantized bit and a combination of quantized bits provided as inputs to the DACs;
apply the gain to each quantized bit provided as inputs to the DACs, based on the feedback signal; and
generate the corrected output based on the quantized bits that are modified with the respective gains applied thereto.

10. The apparatus of claim 9, wherein generating the feedback signal includes subtracting, for respective values corresponding to each DAC, an averaged value corresponding to the digital outputs of all of the DACs.

11. The apparatus of claim 10, wherein generating the feedback signal includes combining the result of the subtracting with the feedback signal.

12. The apparatus of claim 9, wherein applying the respective gains includes, for respective ones of the analog DACs, applying different gains to different ones quantized bits provided to the respective DACs, each gain being tailored to a mismatch of an output of the ADC relative to a corresponding input to the DACs.

13. The apparatus of claim 9, further including a circuit configured and arranged to generate and randomize quantized bits provided as inputs to the plurality of DACs.

14. A method for error compensation in an analog-to-digital converter circuit (ADC) having a digital-to-analog converter circuit (DAC) that generates an analog signal used in converting an analog input signal to a digital signal, the method comprising:
for each respective bit of a digital signal converted by the DAC,
generating a feedback signal indicative of a mismatch between an analog output of the DAC, as converted to a digital signal by the ADC, and a digital signal input to the DAC; and
applying a gain to the bit of the digital signal converted by the DAC based on the feedback signal; and
compensating for errors in the DAC using the respective bits of the digital signal with the gain applied thereto;
wherein generating the feedback signal includes multiplying the respective bit with a corresponding bit output by the ADC.

15. The method of claim 14, wherein generating the feedback signal includes subtracting an averaged value corresponding to all bits provided to the DAC, from the value of the bit for which the feedback signal is generated.

16. The method of claim 14, wherein generating the feedback signal includes setting the gain as a variable gain that compensates for conversion of the digital bits to which the variable gain is being applied.

17. The method of claim 14, wherein applying the gain includes applying different gains to different ones of the respective bits, each gain being tailored to a mismatch of the output of the DAC, relative to the input to the DAC.

18. An apparatus for estimating and correcting errors in an analog-to-digital converter circuit (ADC), the apparatus comprising:
a plurality of variable gain circuits respectively configured and arranged to apply a gain to a portion of a digital signal provided to a digital-to-analog converter circuit (DAC) based on feedback signals for each respective portion of the signal;
a feedback circuit configured and arranged to generate the feedback signal for each DAC, each feedback signal being based on an output of the DAC for which it is provided and an input signal provided to the DAC, the feedback signal generated by subtracting an averaged value corresponding to the digital signals provided to all of the DACs; and
an output circuit configured and arranged to correct the output of the ADC using the respective outputs of the variable gain circuits.

* * * * *